(12) United States Patent
Horine et al.

(10) Patent No.: US 6,353,539 B1
(45) Date of Patent: Mar. 5, 2002

(54) METHOD AND APPARATUS FOR MATCHED LENGTH ROUTING OF BACK-TO-BACK PACKAGE PLACEMENT

(75) Inventors: Bryce D. Horine, Aloha; Michael W. Leddige, Beaverton, both of OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 09/120,517

(22) Filed: Jul. 21, 1998

(51) Int. Cl.[7] ................................................. H05K 7/02
(52) U.S. Cl. ....................... 361/736; 361/784; 361/763; 361/765; 361/803; 257/723; 257/686; 439/638; 365/63; 228/180.21
(58) Field of Search ................................. 361/736, 784, 361/763, 743, 782, 811, 765, 803, 785; 365/51, 52, 63, 226; 257/723, 712, 686; 439/61, 67, 624, 638; 228/180.21

(56) References Cited

U.S. PATENT DOCUMENTS

| | | | | |
|---|---|---|---|---|
| 5,260,892 A | * | 11/1993 | Testa | 365/63 |
| 5,396,102 A | * | 3/1995 | Toshio et al. | 257/723 |
| 5,412,538 A | * | 5/1995 | Kikinis et al. | 361/792 |
| 5,513,135 A | * | 4/1996 | Dell et al. | 365/52 |
| 5,996,880 A | * | 12/1999 | Chu et al. | 228/180.21 |
| 6,021,048 A | * | 2/2000 | Smith | 361/736 |
| 6,094,355 A | * | 7/2000 | Vakilian | 361/761 |
| 6,097,883 A | * | 8/2000 | Dell et al. | 395/282 |

* cited by examiner

Primary Examiner—Leo P. Picard
Assistant Examiner—David Foster
(74) Attorney, Agent, or Firm—Blakely, Sokoloff, Taylor & Zafman LLP

(57) ABSTRACT

A printed circuit board includes a first component mounted on a first side of the printed circuit board. A second component has an identical pin-out as the first component. The second component is mounted on a second side of the printed circuit board. A first signal line connects a first landpad coupled to a first contact on the first component with a second landpad coupled to a corresponding first contact on the second component. A second signal line connects a third landpad coupled to a second contact on the first component with a fourth land pad coupled to a corresponding second contact on the second component. The first signal line has is equal in length to the second signal line.

21 Claims, 7 Drawing Sheets

FIG_1

FIG_2

FIG_3

FIG_4 (PRIOR ART)

FIG_6

METHOD AND APPARATUS FOR MATCHED LENGTH ROUTING OF BACK-TO-BACK PACKAGE PLACEMENT

FIELD OF THE INVENTION

The present invention relates to computer systems. More specifically the present invention relates to a method and apparatus for matched length routing for connecting land pads of components placed back-to-back on a printed circuit board in a computer system.

BACKGROUND OF THE INVENTION

Computer systems often include components that are mounted on double sided printed circuit boards. When such components have identical (non-mirrored) pin-outs and require their corresponding contacts to be connected, internal layers of the printed circuit boards are typically utilized to provide a routing path. When routing components with identical pin-outs back-to-back on double sided printed circuit board, the signal line routed from a land pad connected to a first contact of a first device on a primary side of the printed circuit board to a land pad connected to a corresponding first contact of a second device on the secondary side differs in length from the signal line routed from a land pad connected to an adjacent second contact on the first device to a corresponding land pad connected to an adjacent second contact of a second device. The difference can be calculated as being approximately two times the package land pitch. The package land pitch may be defined as the distance measured between contacts of a component.

The length of a signal line between the contacts of two devices may be measured by the stub lengths on each side of the printed circuit board and the pitch between the devices. The stub length may be defined as the distance between a land pad connected to a contact of the component and a "T" point of a via. The pitch may be defined as the distance of the trace connecting the vias connected to the stubs. The length of a signal line determines the electrical delay and capacitance on the signal line. Differences in electrical delay and capacitance between signal lines may adversely effect the performance of components operating at high speeds.

SUMMARY

A printed circuit board is disclosed. The printed circuit board includes a first component mounted on a first side of the printed circuit board. A second component has an identical pin-out as the first component. The second component is mounted on a second side of the printed circuit board. A first signal line connects a first landpad coupled to a first contact on the first component with a second landpad coupled to a corresponding first contact on the second component. A second signal line connects a third landpad coupled to a second contact on the first component with a fourth land pad coupled to a corresponding second contact on the second component. The first signal line is equal in length to the second signal line.

BRIEF DESCRIPTION OF THE DRAWINGS

The present invention is illustrated by way of example and not by way of limitation in the figures of the accompanying drawings, in which the like references indicate similar elements in and in which.

DETAILED DESCRIPTION

Figure 1:
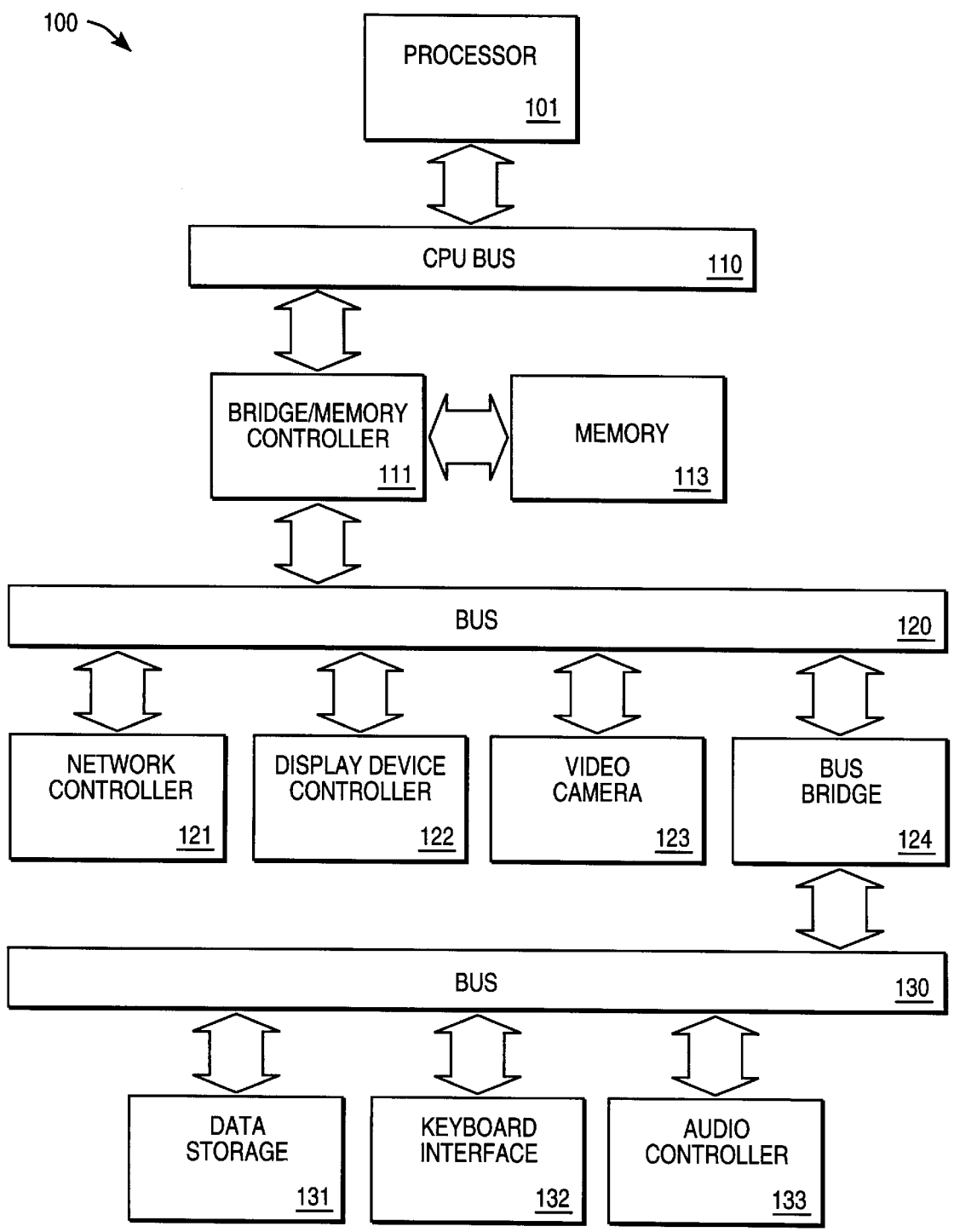
FIG. 1 is a block diagram of a computer system implementing an embodiment of the present invention.

FIG. 1 illustrates a computer system 100 upon which an embodiment of the present invention can be implemented. The computer system 100 includes a processor 101 that processes data signals. The processor 101 may be a complex instruction set computer (CISC) microprocessor, a reduced instruction set computing (RISC) microprocessor, a very long instruction word (VLIW) microprocessor, a processor implementing a combination of instruction sets, or other processor device. FIG. 1 shows an example of the present invention implemented on a single processor computer system 100. However, it is understood that the present invention may be implemented in a computer system having multiple processors. The processor 101 is coupled to a CPU bus 110 that transmits data signals between processor 101 and other components in the computer system 100.

The computer system 100 includes a memory 113. The memory 113 may be a dynamic random access memory (DRAM) device, a synchronous dynamic random access memory (SDRAM) device, or other memory device. The memory 113 may store instructions and code represented by data signals that may be executed by the processor 101. According to an embodiment of the computer system 100, the memory 113 comprises a memory system having a plurality of memory modules. Each of the memory modules comprises a printed circuit board having a plurality of memory devices mounted on the printed circuit board. The printed circuit board operates as a daughter card insertable into a socket connector that is connected to the computer system 100.

A bridge memory controller 111 is coupled to the CPU bus 110 and the memory 113. The bridge memory controller 111 directs data signals between the processor 101, the memory 113, and other components in the computer system 100 and bridges the data signals between the CPU bus 110, the memory 113, and a first I/O bus 120.

The first I/O bus 120 may be a single bus or a combination of multiple buses. As an example, the first I/O bus 120 may comprise a Peripheral Component Interconnect (PCI) bus, a Personal Computer Memory Card International Association (PCMCIA) bus, a NuBus, or other buses. The first I/O bus 120 provides communication links between components in the computer system 100. A network controller 121 is coupled to the first I/O bus 120. The network controller 121 links the computer system 100 to a network of computers (not shown in FIG. 1) and supports communication among the machines. A display device controller 122 is coupled to the first I/O bus 120. The display device controller 122 allows coupling of a display device (not shown) to the computer system 100 and acts as an interface between the display device and the computer system 100. The display device controller 122 may be a monochrome display adapter (MDA) card, a color graphics adapter (CGA) card, an enhanced graphics adapter (EGA) card, an extended graphics array (XGA) card or other display device controller. The display device may be a television set, a computer monitor, a flat panel display or other display device. The display device receives data signals from the processor 101 through the display device controller 122 and displays the information and data signals to the user of the computer system 100. A video camera 123 is coupled to the first I/O bus 120.

A second I/O bus 130 may be a single bus or a combination of multiple buses. As an example, the second I/O bus 130 may comprise a PCI bus, a PCMCIA bus, a NuBus, an Industry Standard Architecture (ISA) bus, or other buses. The second I/O bus 130 provides communication links between components in the computer system 100. A data storage device 131 is coupled to the second I/O bus 130. The data storage device 131 may be a hard disk drive, a floppy disk drive, a CD-ROM device, a flash memory device or other mass storage device. A keyboard interface 132 is coupled to the second I/O bus 130. The keyboard interface 132 may be a keyboard controller or other keyboard interface. The keyboard interface 132 may be a dedicated device or can reside in another device such as a bus controller or other controller. The keyboard interface 132 allows coupling of a keyboard (not shown) to the computer system 100 and transmits data signals from a keyboard to the computer system 100. An audio controller 133 is coupled to the second I/O bus 130. The audio controller 133 operates to coordinate the recording and playing of sounds is also coupled to the I/O bus 130.

A bus bridge 124 couples the first I/O bus 120 to the second I/O bus 130. The bus bridge 124 operates to buffer and bridge data signals between the first I/O bus 120 and the second I/O bus 130.

Figure 2:
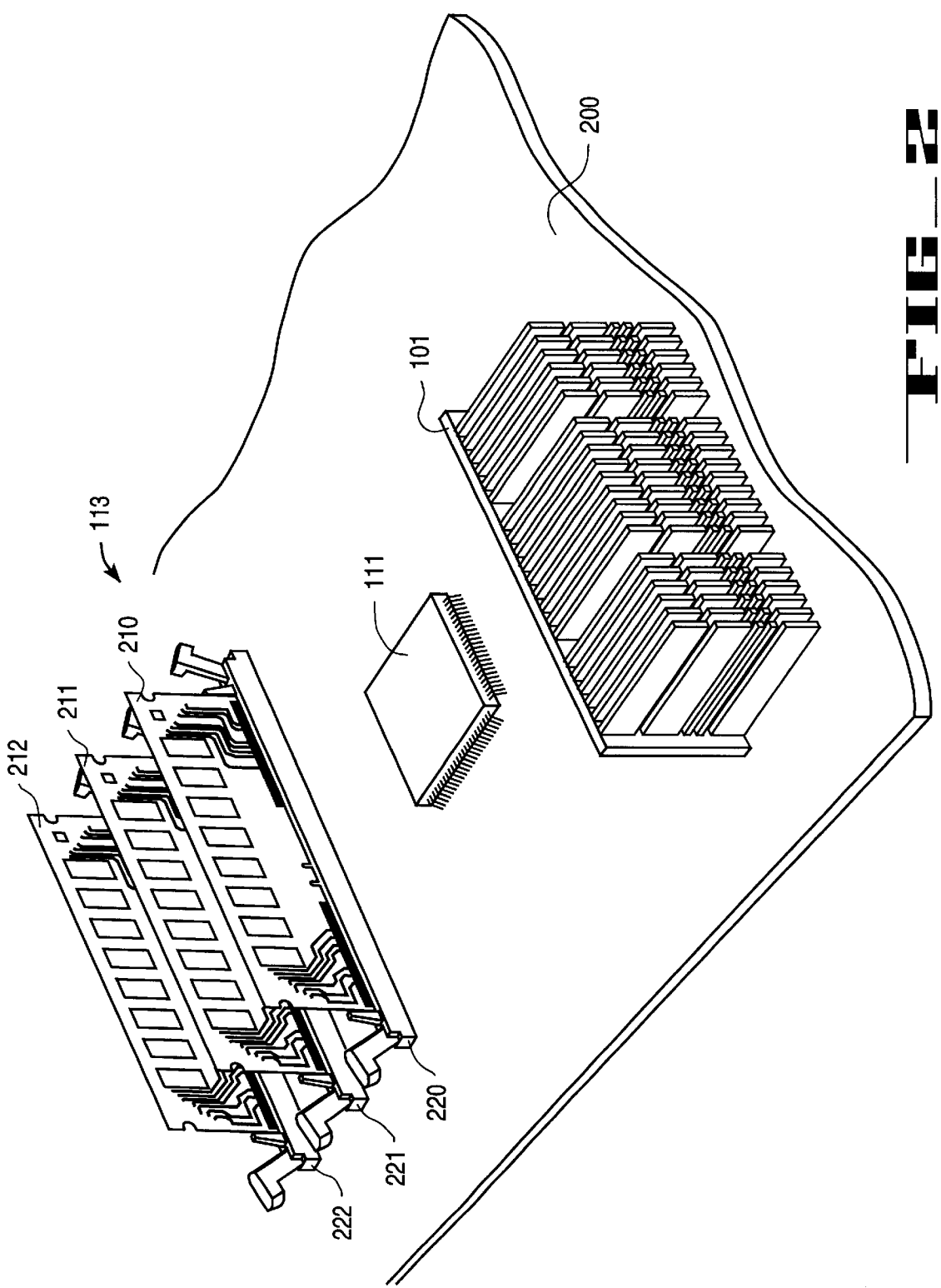
FIG. 2 illustrates a memory system mounted on a motherboard according to an embodiment of the present invention.

FIG. 2 illustrates a memory system 113 according to an embodiment of the present invention. The memory system 113 resides on a motherboard 200 of the computer system 100 (shown in FIG. 1). The motherboard 200 is a printed circuit board that interconnects components of the computer system 100 such as the bridge memory controller 111, the processor 101 and other components. The memory system 113 includes a plurality of memory modules 210–212. Each of the memory modules includes a plurality of memory devices mounted on the memory module. The memory system also includes a plurality of socket connectors 220–222 mounted on the motherboard 200. The memory modules 210–212 are insertable into the socket connectors 220–222. Electrical connectors on the memory module interface with electrical contacts in the socket connector. The electrical connectors and the electrical contacts allow components on the motherboard 200 to access the memory devices on the memory module. It should be appreciated that any number of socket connectors may be mounted on the motherboard to receive any number of memory modules . It should also be appreciated that any number of memory devices may be mounted on each memory module.

Figure 3:
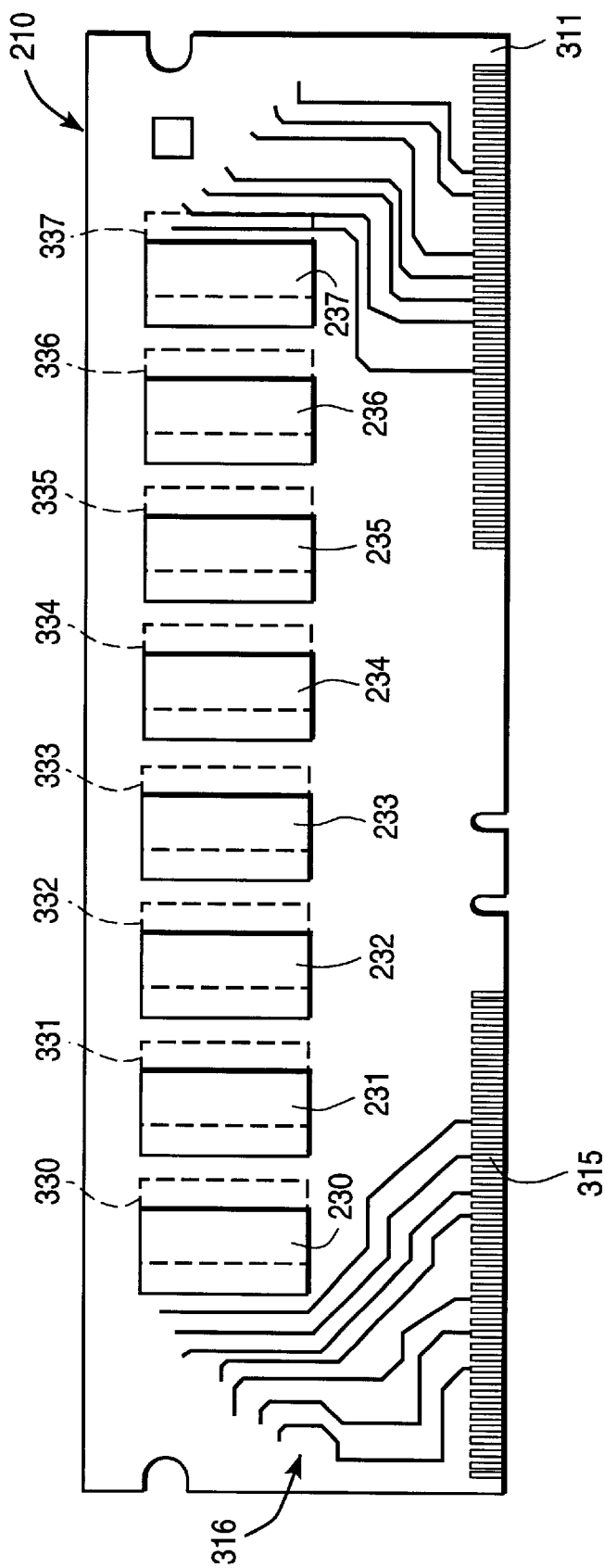
FIG. 3 illustrates an exemplary memory module according to an embodiment of the present invention.

FIG. 3 illustrates an exemplary memory module 210 according to an embodiment of the present invention. The memory module 210 includes electrical connector pads 315 that operates to transmit signals between the bridge memory controller 111 and the memory devices on the memory module 210. According to an embodiment of the present invention, the electrical connector pads make contact with socket connector 220 (shown in FIG. 2) to transmit address, data, control, and clock signals.

The memory module 210 includes a plurality of memory devices 230–237 on a first side 311 of the memory module 210 and a plurality of memory devices 330–337 on a second side (not shown) of the memory module 210. The memory devices 230–237 and 330–337 are serially connected with each other. Each memory device is connected to at least one other memory device on the opposite side of the memory module 210. Memory device 230 is connected to memory device 330. Memory device 330 is connected to memory device 231. Memory device 231 is connected to memory device 331. Memory device 331 is connected to memory device 232. Memory device 232 is connected to memory device 332. Memory device 332 is connected to memory device 233. Memory device 233 is connected to memory device 333. Memory device 333 is connected to memory device 234. Memory device 234 is connected to memory device 334. Memory device 334 is connected to memory device 235. Memory device 235 is connected to memory device 335. Memory device 335 is connected to memory device 236. Memory device 236 is connected to memory device 336. Memory device 336 is connected to memory device 237. Memory device 237 is connected to memory device 337. The signals from the electrical connector 315 are transmitted first to memory device 230 via routing traces 316. The signals are then transmitted serially from the memory device 230 to the other memory devices 231–237, and 330–337 and are routed to the socket connector 220 via the electrical connector pads 315.

According to an embodiment of the present invention, the memory devices 230–237 and 330–337 are identical components having identical packaging and identical pin-outs. A pinout refers to the purpose of each pin in a multi-pin hardware connection interface. The memory devices 230–237 and 330–337 have matched component to component pitch and stub lengths from a via "T" point to the land pad of the component. By matching the signal line between the memory devices 230–237 and 330–337, the electrical delay of signals transmitted between memory devices 230–237 and 330–337 are matched even when signals are transmitted to the memory devices 230–237 and 330–337 at high frequencies.

According to an embodiment of the present invention, the memory devices 230–237 and 330–337 are SDRAM devices. It should be appreciated that any type of memory devices may be mounted on the memory module 210. The memory devices 230–237 and 330–337 may be packaged in a ball grid array (BGA), chip scale package (CSP), or other type of packaging.

Figure 4:
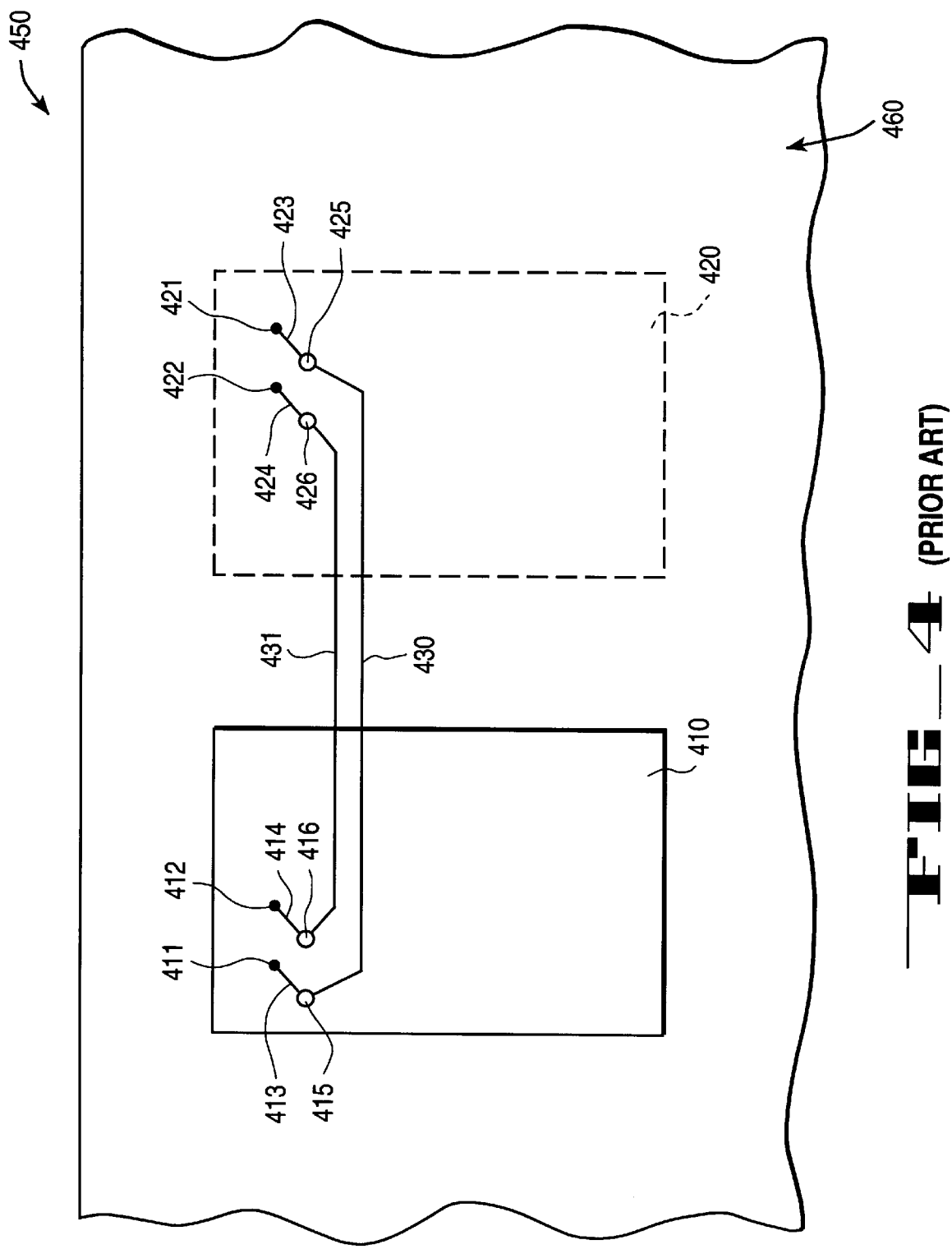
FIG. 4 illustrates prior art routing techniques for connecting land pads for components placed back-to-back on a printed circuit board.

FIG. 4 illustrates a prior art routing technique for connecting land pads of components placed back-to-back on a printed circuit board. A first component 410 is mounted on a first side 460 of a printed circuit board 450. A second component 420 is mounted on a second side (not shown) of the printed circuit board 450. The first and second components 410 and 420 have identical pin-outs and require their corresponding contacts to be connected. A first contact (not shown) on the first component 410 interfaces with a first land pad 411 on the first side 460 of the printed circuit board 450. A second contact (not shown) on the first component 410 interfaces with a second land pad 412 on the first side 460 of the printed circuit board 450. A first contact (not shown) on the second component 420 interfaces with a first land pad 421 on the second side of the printed circuit board 450. A second contact (not shown) on the second component 420 interfaces with a second land pad 422 on the second side of the printed circuit board 450.

The land pad 411 on the first side 460 of the printed circuit board 450 is connected to the land pad 421 on the second side of the printed circuit board 450. A stub 413 on the first side 460 of the printed circuit board 450 connects the land pad 411 to a via 415 on the first side 460 of the printed circuit board 450. The via 415 is connected to a trace 430 on a first internal layer (not shown) of the printed circuit board 450 which is connected to a via 425. The via 425 is connected to a stub 423 on the second side of the printed circuit board 450 that is connected to the land pad 421. The land pad 412 on the first side 460 of the printed circuit board 450 is connected to the land pad 422 on the second side of the printed circuit board 450. A stub 414 on the first side 460 of the printed circuit board 450 connects the land pad 412 to a via 416 on the first side 460 of the printed circuit board 450. The via 416 is connected to a trace 431 on a second internal layer (not shown) of the printed circuit board 450 which is connected to a via 426. The via 426 is connected to a stub 424 on the second side of the printed circuit board 450 that is connected to the land pad 422.

When routing components with identical pin-outs back-to-back on double sided printed circuit board such as the components 410 and 420, the signal line routed from a land pad of a first contact of a first device on a first side of the printed circuit board to a land pad of a corresponding first contact of a second device on the second side differs in length from the linesignal routed from a land pad of an adjacent second contact on the first device to a corresponding land pad of an adjacent second contact of a second device. The difference can be calculated as being approximately two times the package land pitch. The package land pitch may be defined as the distance measured between contacts of a component.

The length of a signal line between the contacts of two devices may be measured by the stub lengths on each side of the printed circuit board and the pitch between the devices. The stub length may be defined as the distance between a land pad and a "T" point of a via. The pitch may be defined as the distance of the trace connecting the vias connected to the stubs. The length of a signal line determines the electrical delay and capacitance on the signal line. Differences in electrical delay and capacitance between signal lines may adversely effect the performance of components operating at high speeds.

Figure 5:
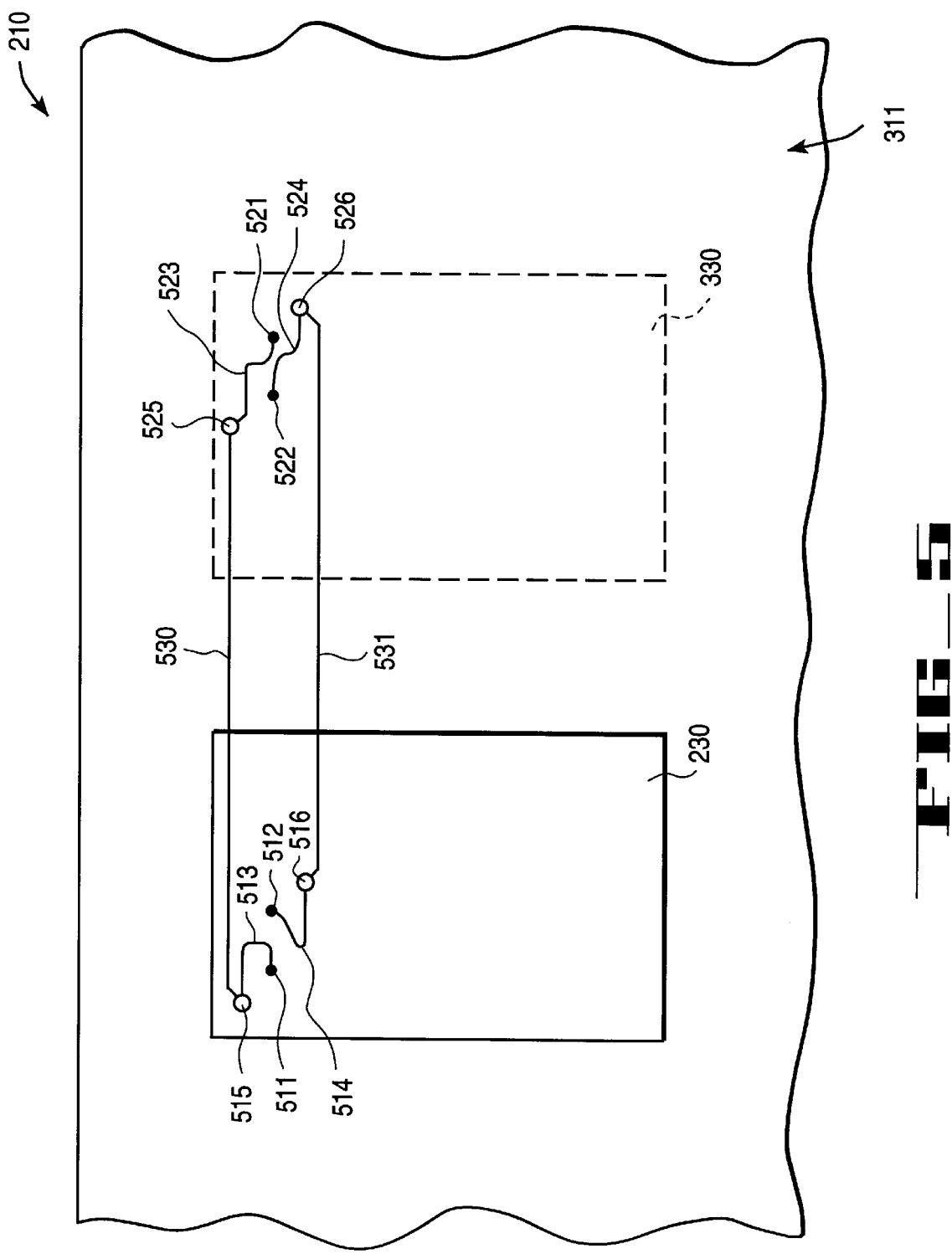
FIG. 5 illustrates an exemplary routing technique used for connecting land pads for memory devices placed back-to-back on a memory module according to an embodiment of the present invention.

FIG. 5 illustrates an exemplary routing technique used for connecting land pads for memory devices 230 and 330 placed back-to-back on the memory module 210 according to an embodiment of the present invention. The memory device 230 has a first contact (not shown) that interfaces with a first land pad 511 on the first side 311 of the memory module 210. The memory device 230 has a second contact (not shown) that interfaces with a second land pad 512 on the first side 311 of the memory module 210. The memory device 330 has a first contact (not shown) that interfaces with a first land pad 521 on the second side (not shown) of the memory module 210. The memory device 330 has a second contact (not shown) that interfaces with a second land pad 522 on the second side of the memory module 210.

The land pad 511 on the first side 311 of the memory module 210 is connected to the land pad 521 on the second side of the memory module 210. A stub 513 on the first side 311 of the memory module 210 connects the land pad 511 to a via 515 on the first side 311 of the memory module 210. The via 515 is connected to a trace 530 on a first internal layer (not shown) of the memory module 210 which is connected to a via 525. The via 525 is connected to a stub 523 on the second side of the memory module 210 that is connected to the land pad 521. The land pad 512 on the first side 311 of the memory module 210 is connected to the land pad 522 on the second side of the memory module 210. A stub 514 on the first side 311 of the memory module 210 connects the land pad 512 to a via 516 on the first side 311 of the memory module 210. The via 516 is connected to a trace 531 on a second internal layer (not shown) of the memory module 210 which is connected to a via 526. The via 526 is connected to a stub 524 on the second side of the memory module 210 that is connected to the land pad 522.

Prior art routing techniques typically placed vias closest to the land pads that they are to be connected to. FIG. 4 shows the via 425 placed next to the land pad 421 and the via 426 placed next to the land pad 422. The placement of the vias 515, 516, 525, and 526 are selected such that the pitches of the traces 530 and 531 are matched in length according to an embodiment of the present invention. In order to match the pitches of trace 530 and 531, via 525 is placed next to land pad 522 and via 526 is placed next to land pad 521. This, in effect, "crosses" the vias 525 and 526 since via 525 is connected to land pad 521, not the closer land pad 522, and via 526 is connected to land pad 522 not the closer land pad 521.

Prior art routing techniques typically routed stubs connecting land pads to vias directly, thus utilizing the minimal amount of stub length. FIG. 4 shows stub 413 directly routing land pad 411 to via 415, stub 414 directly routing land pad 412 to via 416, stub 423 directly routing land pad 421 to via 425, and stub 424 directly routing land pad 422 to via 426. By crossing the vias 525 and 526, the stub 523 connecting land pad 521 and via 525 and the stub 524 connecting land pad 522 and via 526 are made longer in length than they would have been had the vias 525 and 526 not been crossed. In order to match the stub lengths of stubs connected to non-crossed vias 515 and 516 to that of the crossed vias 525 and 526, additional stub lengths are added to stubs 513 and 514, according to an embodiment of the present invention, by routing a non-direct connection between their respective land pads and vias.

It should be appreciated that the routing technique described for matching the component to component pitch of memory devices 230 and 330 and the stub lengths from the via "T" points to the lad pads of memory devices 230 and 330 may be used for matching component to component pitch and stub lengths for other types of components placed back-to-back on a printed circuit board. It should also be appreciated that in matching the component to component pitch, the vias may be placed at any location on the printed circuit, and that both or neither set of vias could be crossed. The routing technique of the present invention allows components to have matching component to component pitch and stub lengths from via "T" points to land pads of the components without requiring one of the components to be a mirrored package of the other. Matching component to component pitch and stub lengths of components placed back-to-back of each other on a printed circuit board without requiring the manufacturing of mirrored packages of the components reduces the over cost of building the product.

Figure 6:
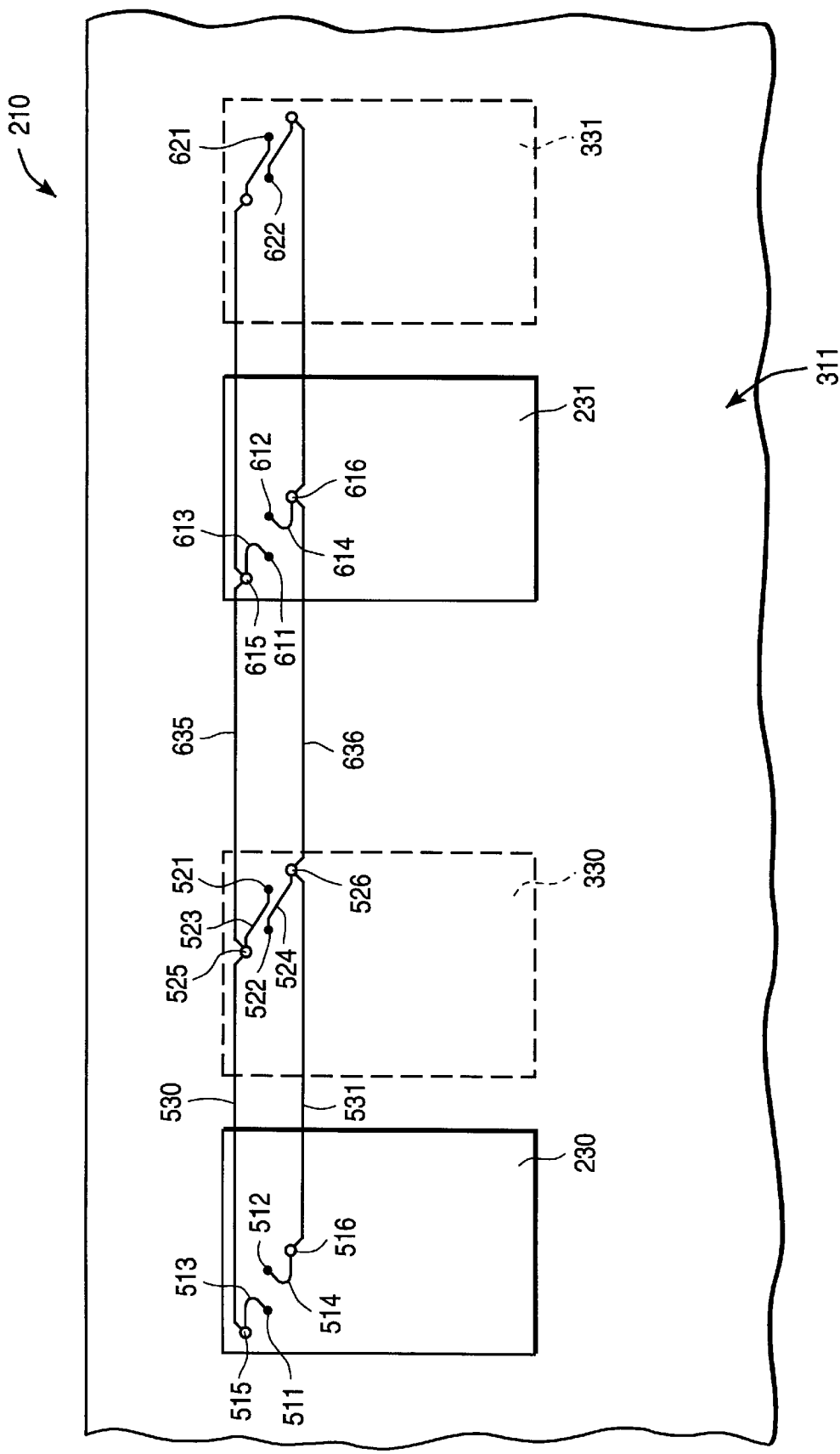
FIG. 6 illustrates a exemplary routing technique used for connecting land pads for memory devices placed back-to-back on a memory module according to a second embodiment of the present invention.

FIG. 5 illustrates the matching of component to component pitch of memory devices 230 and 330 and the stub lengths from via "T" points to the land pads of memory devices 230 and 330 for two contact points on the memory devices 230 and 330 that required connections. It should be appreciated that the routing technique described may be used for matching the pitch and stub lengths for any number of contact points on the memory devices 230 and 330. It should also be appreciated that the described technique may be used to match the pitch and stub lengths for additional memory devices on the memory module 311 as illustrated in FIG. 6. The matching of component to component pitch and stub lengths allow the component pitch and stub lengths to be substantially equal in physical length within a predetermined tolerance under current manufacturing capabilities that yield unmeasurable and/or insignificant differences in electrical characteristics.

FIG. 6 illustrates an exemplary routing technique used for connecting land pads for memory devices placed back-to-back on a memory module as shown in FIG. 3 with additional memory device 231 on the first side 311 of the memory module 210 and memory device 331 on the second side (not shown) of the memory module 210. The memory device 231 has a first contact (not shown) that interfaces with a first land pad 611 on the first side 311 of the memory module 210. The memory device 231 has a second contact (not shown) that interfaces with a second land pad 612 on the first side 311 of the memory module 210.

The land pad 611 on the first side 311 of the memory module 210 is connected to the land pad 521 on the second side of the memory module 210. A stub 613 on the first side 311 of the memory module 210 connects the land pad 611 to a via 615 on the first side 311 of the memory module 210. The via 615 is connected to a trace 635 on the first internal layer (not shown) of the memory module 210 which is connected to the via 525. The via 525 is connected to the stub 523 on the second side of the memory module 210 that is connected to the land pad 521. The land pad 612 on the first side 311 of the memory module 210 is connected to the land pad 522 on the second side of the memory module 210. A stub 614 on the first side 311 of the memory module 210 connects the land pad 612 to a via 616 on the first side 311 of the memory module 210. The via 616 is connected to a trace 636 on the second internal layer (not shown) of the memory module 210 which is connected to a via 526. The via 526 is connected to a stub 524 on the second side of the memory module 210 that is connected to the land pad 522.

The placement of the vias 615 and 616 are selected such that the pitches of the traces 635 and 636 are matched in length with traces 530 and 531. In order to match the stub lengths of stubs 613 and 614 with stubs 523 and 524 additional stub lengths are added to stubs 613 and 614 by routing a non-direct connection between their respective land pads and vias.

The memory device 331 has a first contact (not shown) that interfaces with a first land pad 621 on the second side (not shown) of the memory module 210. The memory device 331 has a second contact (not shown) that interfaces with a second land pad 622 on the second side of the memory module 210. The land pad 621 is connected with the land pad 611 and the land pad 622 is connected with the land pad 612 using techniques similar to that described for connecting the land pad 511 with the land pad 521 and the land pad 512 with the land pad 522.

Figure 7:
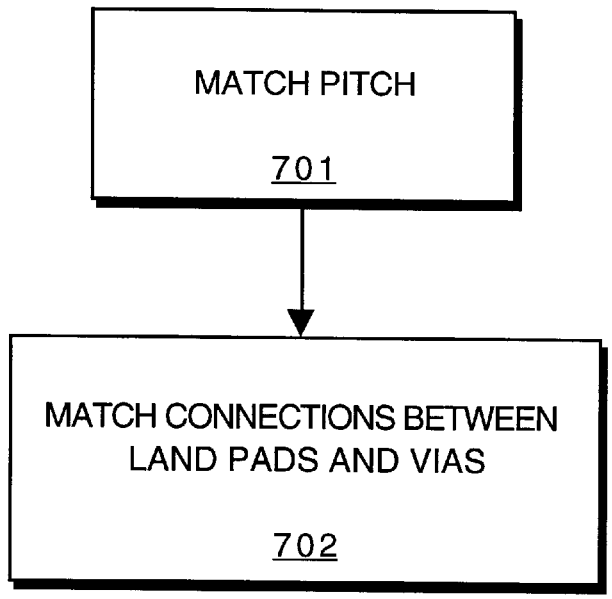
FIG. 7 is a flow chart illustrating a method for routing signals according to an embodiment of the present invention.

FIG. 7 is a flow chart illustrating a method for routing signals between a first component on a first side of a printed circuit board and a second component on a second side of the printed circuit board. At step 701, a first pitch of a first trace carrying a first signal from a first via attached to a land of a first component on the first side of the printed circuit board to a second via attached to a land of a second component on the second side of the printed circuit board is matched with a second pitch of a second trace carrying a second signal from a third via attached to a land of a first component on the first side of the printed circuit board to a fourth via attached to a land of a second component on the second side of the printed circuit board. According to an embodiment of the present invention, matching the first pitch and the second pitch is achieved by selecting a placement of the first, second, third, and fourth vias such that a distance between the first and the second vias is equal to a distance between the third and fourth vias. The selecting of the placement of the vias may include crossing the first and third vias or crossing the second and fourth vias.

At step 702, the distances of connections between the first via and a first land pad connected to a first contact of the first component, the second via and a second land pad connected to a first contact of the second component, the third via and a third land pad connected to a second contact of the first component, and the fourth via and a fourth land pad connected to a second contact on the second component are matched. According to an embodiment of the present invention, the distances of the connections are matched by adding stub length to connections shorter than the longest connection.

In the foregoing description, the invention is described with reference to specific exemplary embodiments thereof. It will, however, be evident that various modifications and changes may be made thereto without departing from the broader spirit and scope of the present invention as set forth in the appended claims. The specification and drawings are to be regarded in an illustrative rather than a restrictive sense.

What is claimed is:

1. A method for routing signals between a first component on a first side of a printed circuit board (PCB) and a second component, with an identical pin-out as the first component, on a second side of the PCB, comprising:

matching a first pitch of a first trace carrying a first signal from a first via on the first side of the PCB to a second via on the second side of the PCB with a second pitch of a second trace carrying a second signal from a third via on the first side of the PCB to a fourth via on the second side of the PCB; and matching distances of connections between the first via and a first land pad that is connected to a first contact of the first component, the second via and a second land pad that is connected to a first contact of the second component, the third via and a third land pad that is connected to a second contact of the first component, and the fourth via and a fourth land pad that is connected to a second contact of the second component.

2. The method of claim 1, wherein matching the first pitch with the second pitch comprises selecting a placement of the first, second, third, and fourth vias such that a distance between the first and second vias is equal to a distance between the third and fourth vias.

3. The method of claim 2, wherein selecting the placement of the first, second, third, and fourth vias comprises crossing the second and the fourth vias.

4. The method of claim 1, wherein the step of matching the distances of the connections comprises adding stub length to shorter connections.

5. A printed circuit board (PCB), comprising:

a first component mounted on a first side of the printed circuit board;

a second component, having an identical pin-out as the first component, mounted on a second side of the printed circuit board;

a first signal line that connects a first landpad coupled to a first contact on the first component with a second landpad coupled to a corresponding first contact on the second component; and a second signal line that connects a third landpad coupled to a second contact on the first component with a fourth land pad coupled to a corresponding second contact on the second component, the first signal line having a length equal to the second signal line.

6. The PCB of claim 5, wherein the first signal line comprises a first trace that resides on a first internal layer of the PCB that connects to a first via on the first side of the PCB and a second via on the second side of the PCB.

7. The PCB of claim 6, wherein the second signal line comprises a second trace that resides on a second internal layer of the PCB that connects a third via on the first side of the PCB and a fourth via on the second side of the PCB.

8. The PCB of claim 7, wherein the first signal line further comprises:

a first stub, that connects the first via to the first land pad, having a first stub length; and a second stub, that connects the second via to the second landpad, having a second stub length.

9. The PCB of claim 8, wherein the second signal line further comprises:

a third stub, that connects the third via to the third landpad, having a third stub length; and a fourth stub, that connects the fourth via to the fourth landpad, having a fourth stub length.

10. The PCB of claim 9, wherein the first and third vias are crossed.

11. The PCB of claim 9, wherein the second and fourth vias are crossed.

12. The PCB of claim 7, wherein the first and second traces are equal in length.

13. The PCB of claim 9, wherein the first, second, third, and fourth stub lengths are equal.

14. A memory module, comprising:

a first memory device residing on a first side of the memory module; and a second memory device, serially connected to the first memory device, residing on a second side of the memory module;

a first signal line that connects a first landpad coupled to a first contact of the first memory device to a second landpad coupled to a first contact of the second memory device; and a second signal line that connects a third landpad coupled to a second contact of the first memory device to a fourth landpad coupled to a second contact of the second memory device, wherein the first and second signal lines are equal in length.

15. The memory module of claim 14, wherein the first signal line comprises a first trace that connects a first via on the first side of the memory module to a second via on the second side of the memory module.

16. The memory module of claim 14, wherein the second signal line comprises a second trace that connects a third via on the first side of the memory module to a fourth via on the second side of the memory module.

17. The memory module of claim 15, wherein the first signal line further comprises:

a first stub that connects a first land pad connected to the first memory device to the first via; and a second stub that connects a second land pad connected to the second memory device to the second via.

18. The memory module of claim 15, wherein the second signal line further comprises:

a third stub that connects a third land pad connected to the first memory device to the third via; and a fourth stub that connects a fourth land pad connected to the second memory device to the fourth via.

19. The memory module of claim 14, wherein the first and second memory devices have identical pin-outs.

20. The memory module of claim 14, further comprising a third memory device, serially connected to the second memory device, residing on the first side of the memory module.

21. A computer system, comprising:

a bus;

a processor coupled to the bus; and a memory module, coupled to the bus, including:

a first memory device residing on a first side of the memory module;

a second memory device, serially connected to the first memory device, residing on a second side of the memory module;

a first signal line that connects a first landpad coupled to a first contact of the first memory device to a second landpad coupled to a first contact of the second memory device; and a second signal line that connects a third landpad coupled to a second contact of the first memory device to a fourth landpad coupled to a second contact of the second memory device, wherein the first and second signal lines are equal in length.

* * * * *